United States Patent
Tuin et al.

(10) Patent No.: US 9,857,544 B2
(45) Date of Patent: Jan. 2, 2018

(54) CARRIER HAVING ABLATION-SUSCEPTIBLE AND ABLATION-INSUSCEPTIBLE MATERIALS

(71) Applicant: TE Connectivity Nederland B.V., AR's-Hertogenbosch (NL)

(72) Inventors: Jacobus Nicolaas Tuin, AR's-Hertogenbosch (NL); Alexander Johannes Adrianus Cornelia Dorrestein, AR's-Hertogenbosch (NL); Jeroen Antonius Maria Duis, AR's-Hertogenbosch (NL); Rutger Wilhelmus Smink, AR's-Hertogenbosch (NL); Michiel van Rijnbach, AR's-Hertogenbosch (NL)

(73) Assignee: TE Connectivity Nederland B.V. (NL)

( * ) Notice: Subject to any disclaimer, the term of this patent is extended or adjusted under 35 U.S.C. 154(b) by 0 days.

(21) Appl. No.: 14/879,382

(22) Filed: Oct. 9, 2015

(65) Prior Publication Data
US 2017/0102509 A1    Apr. 13, 2017

(51) Int. Cl.
G02B 6/42 (2006.01)
G02B 6/43 (2006.01)
G02B 6/136 (2006.01)
H01L 23/495 (2006.01)
H01L 23/498 (2006.01)
G02B 6/12 (2006.01)

(52) U.S. Cl.
CPC ........... *G02B 6/4257* (2013.01); *G02B 6/136* (2013.01); *G02B 6/423* (2013.01); *G02B 6/4295* (2013.01); *G02B 6/43* (2013.01); *H01L 23/49579* (2013.01); *H01L 23/49822* (2013.01); *H01L 23/49866* (2013.01); *G02B 2006/12173* (2013.01); *G02B 2006/12176* (2013.01)

(58) Field of Classification Search
CPC ...... H05K 1/115; H05K 1/0298; H05K 1/111; H05K 1/181; H05K 5/0005; H05K 3/303; H05K 3/32; H05K 3/2201
USPC .... 385/14, 50–52, 88, 91–93, 147; 361/760, 361/752, 772; 29/832
See application file for complete search history.

(56) References Cited

U.S. PATENT DOCUMENTS

| | | | | |
|---|---|---|---|---|
| 4,863,806 A | * | 9/1989 | Merrick | H01L 31/167 257/432 |
| 5,631,571 A | * | 5/1997 | Spaziani | G01R 1/071 324/658 |
| 5,737,467 A | * | 4/1998 | Kato | G02B 6/30 385/78 |
| 6,027,255 A | * | 2/2000 | Joo | G02B 6/4212 385/88 |
| 6,385,361 B1 | * | 5/2002 | Corr | G02B 6/12 385/14 |
| 6,690,845 B1 | * | 2/2004 | Yoshimura | G02B 6/12002 257/E23.01 |
| 7,251,389 B2 | * | 7/2007 | Lu | G02B 6/2852 385/14 |

(Continued)

OTHER PUBLICATIONS

European Search Report dated Feb. 8, 2017, for counterpart European patent application No. 16192688.6, 4 pages.

*Primary Examiner* — Akm Enayet Ullah

(57) ABSTRACT

A low-cost and mass producible carrier part for precise mounting of optical components such as an optical fiber and optical die and associated fabrication process.

18 Claims, 13 Drawing Sheets

(56) References Cited

U.S. PATENT DOCUMENTS

| | | | |
|---|---|---|---|
| 7,476,037 B2 * | 1/2009 | Golwalkar | G02B 6/4201 |
| | | | 264/1.24 |
| 9,360,644 B2 * | 6/2016 | Fasano | G02B 6/122 |
| 2005/0141094 A1 * | 6/2005 | Wild | B42D 25/328 |
| | | | 359/586 |
| 2010/0035052 A1 * | 2/2010 | Farah | G02B 6/30 |
| | | | 428/336 |

* cited by examiner

CARRIER HAVING ABLATION-SUSCEPTIBLE AND ABLATION-INSUSCEPTIBLE MATERIALS

FIELD OF INVENTION

The invention relates generally to optoelectronics and a fabrication process for generating a carrier part allowing the precise mounting and alignment of optical elements.

BACKGROUND

Manufacturing a precision optical link between two optical components is typically complex and expensive. For example, the alignment of an optical fiber and an optical die (laser diode, photo diode) is crucial and requires significant precision.

It is common industry practice to mount an optical die with its active layer (the plane of the wafer) parallel to a carrier such as a PCB or glass plate. The optical axis is then perpendicular to the surface of the carrier or circuit board. In many cases it is practical to orient the axis of the fiber parallel to the surface of the carrier or circuit board, in which case it becomes necessary to redirect the light by means of, for example, a mirror combined with a lens. Thus, conventional coupling schemes involve a perpendicular arrangement of the optical axes of the fiber and die and use of a mirror to redirect the light normally in combination with a lens or multiple lenses.

The requirement for a mirror and lens also arises from the scenario in which an optical die such as a photodiode is to be mounted on a circuit board that already has existing traces defined such that the optical fiber requires precise alignment with the circuit board. In order to achieve the optical link in this scenario, the light beam emitted from the fiber must be bent so that beam is perpendicular to the circuit board. Further, some distance must be allowed for light propagation, which also requires the use of a lens for focusing.

Applicants recognize a need for a low cost and mass producible apparatus and associated manufacturing process facilitating precise alignment of optical components such as an optical fiber and an optical die.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Applicants recognize that typical approaches for building an optical link especially in the case of a printed circuit board are costly and inconvenient and may not scale well for mass production. To minimize these shortcomings, Applicants propose a carrier part and fabrication process that allows assembly of both an optical die and fiber on the same carrier part using the same reference features for each component.

Such an apparatus provides many important benefits including precision butt coupling an optical die to an optical fiber, having the optical axes of the die and fiber in line and obviating the need for a lens in between. A mounting pad arrangement is provided such that the optical axis of an optical die is mounted in-line with the axis of an optical fiber. Redirection of the light from the optical fiber is obviated and the die and fiber can be butt coupled without any optical components in between. This provides the advantage of eliminating absorption and/or reflection losses from optical components.

In addition to a mechanical function, the carrier part also provides electrical tracks and connection to the optical die without the requirement of introducing additional parts. The carrier part can also provide a bonding area for a driver or amplifier chip and in that way allows the electrical lines between the chip and optical die to be short, which is beneficial for signal integrity. Moreover, a multilayer carrier can also be used offering more electrical design flexibility, e.g., reducing cross-talk. Owing to the good thermal conductivity of the carrier, it serves as a heat-spreader, reducing the need to use expensive thermal bridges to the outside of the casing.

A complete "optical engine" can be created comprised of the carrier part, a mounted optical die and mounted driver or amplifier chip. The optical engine provides pads for connecting it to the PCB of a device and alignment features, which are suited for passively aligning and fixating the fiber. The optical engine serves to connect the optical fiber to the electrical PCB and handles the conversion between the two and requires only a minimum of components.

The carrier part can be mass-produced with existing production processes. A large number of these parts may be processed simultaneously within the structure of a larger panel. Further, fabrication of a carrier part does not require tight positioning accuracy of a laser.

One aspect of the invention is a carrier for precisely mounting at least two optical elements comprising a plurality of alternating layers, each layer comprised of one of either a first and second material taken from a group, the first material susceptible to erosion by an ablation process and the second material insusceptible to erosion by an ablation process, wherein each layer comprised of the second material assumes a respective geometric pattern such that upon application of an ablation process to the plurality of alternating layers, a plurality of features is generated, wherein each of the generated features provides a respective mounting for each of the at least two optical elements.

Another aspect of the invention is a method for fabricating an optoelectronic mounting part comprising defining a plurality of alternating layers, comprised of one of either a first and second material taken from a group, the first material susceptible to erosion by an ablation process and the second material insusceptible to erosion by an ablation process, etching each of the layers comprising the second material to create a respective geometric pattern, wherein the combination of the geometric patterns correspond to a plurality of features for mounting of at least one optical element and applying a laser ablation process to the plurality of alternating layers to generate the features.

Another aspect of the invention is an optical engine comprising a carrier part, wherein the carrier part further comprises at least one geometric feature for mounting at least one optical element, said at least one geometric feature generated from an ablation process applied to a plurality of alternating layers, each layer comprised of one of either a first and second material taken from a group, the first material susceptible to erosion by an ablation process and the second material insusceptible to erosion by an ablation process, an optical die an optical amplifier and at least one pad for coupling to a printed circuit board ("PCB").

DETAILED DESCRIPTION

Ablation Insusceptible and Ablation Susceptible Layers and Ablation Process

Figure 1A:
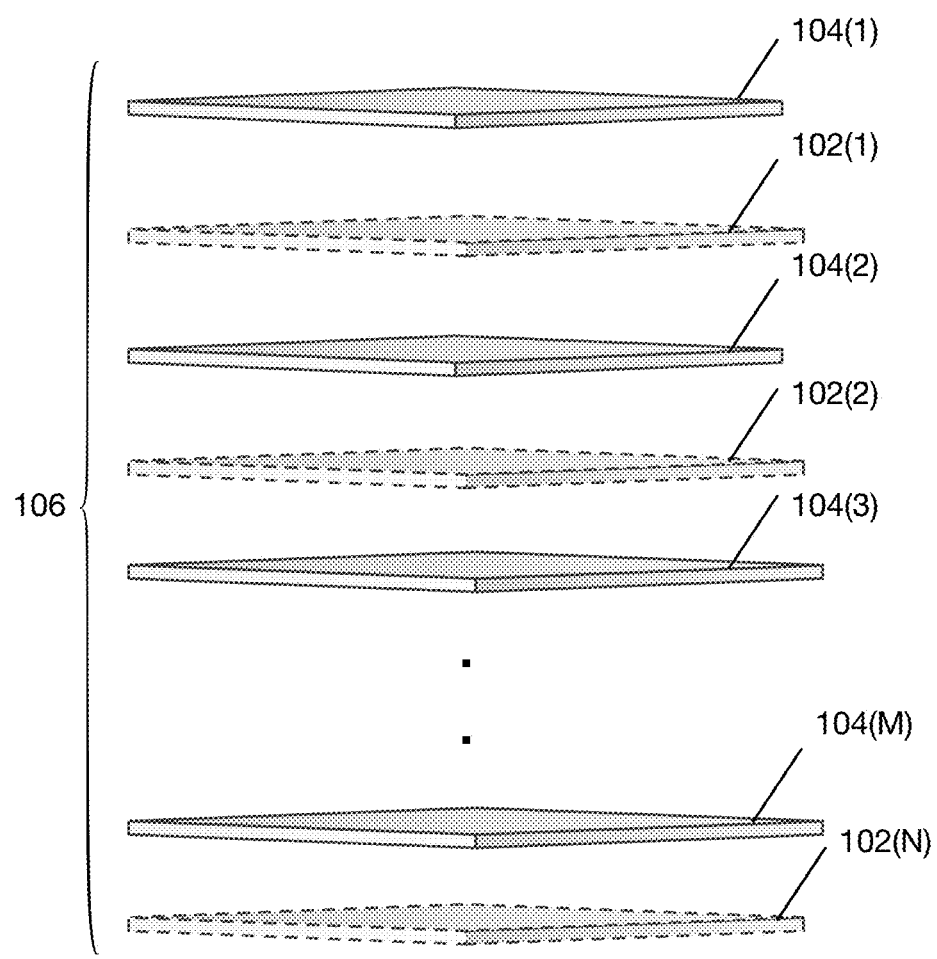
FIG. 1A shows a stack of alternating ablation susceptible and ablation insusceptible layers for generating an optical mounting structure according to one embodiment.

FIG. 1A shows a stack of alternating ablation susceptible and ablation insusceptible layers for generating an optical mounting structure according to one embodiment. Stack 106 comprises ablation insusceptible layers 104(1)-104(M) and ablation susceptible layers 102(1)-102(N). Ablation insusceptible layers 104(1)-104(M) each may exhibit a respective geometric pattern (not shown in FIG. 1A) and are insusceptible to erosion by an ablation process. According to one embodiment, layers 104(1)-104(M) may be comprised of copper. However, ablation insusceptible layers may be comprised of other materials including, for example, gold, nickel and other metals.

Ablation susceptible layers 102(1)-102(N) are susceptible to ablation by a laser process. According to one embodiment, ablation susceptible layers 102(1)-102(N) may be comprised of polyimide. However, ablation susceptible layers may be comprised of other materials including, for example, epoxy, and other polymer materials generally. As depicted in FIG. 1A, each of the ablation insusceptible layers 104(1)-104(M) is alternated with a respective ablation susceptible layer 102(1)-102(N) and arranged in stacked configuration.

Figure 1B:
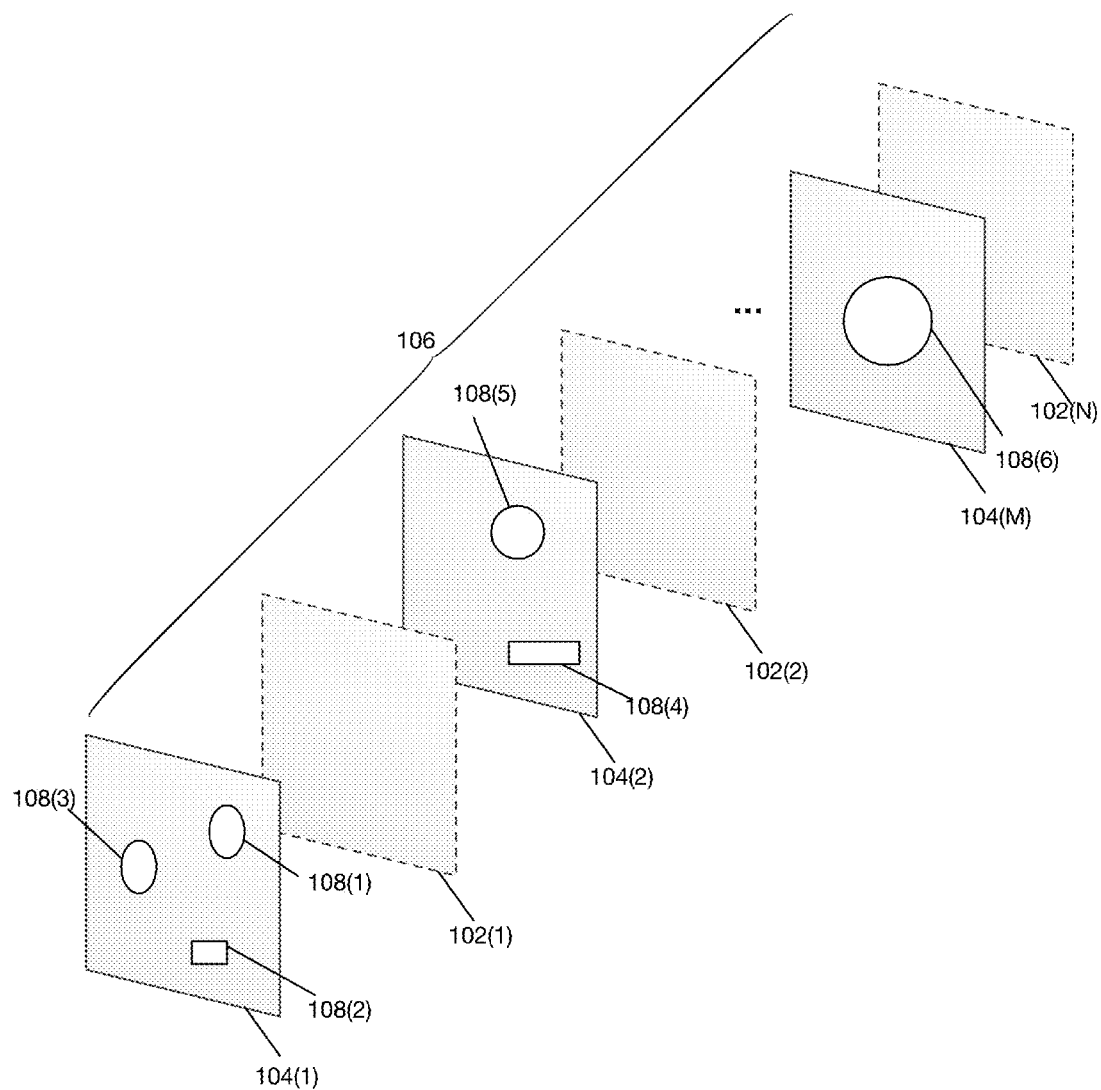
FIG. 1B shows in more detail a stack of alternating ablation susceptible and ablation insusceptible layers for generating an optical mounting component according to one embodiment.

FIG. 1B shows in more detail a stack of alternating ablation susceptible and ablation insusceptible layers for generating an optical mounting component according to one embodiment. Stack 106 comprises ablation insusceptible layers 104(1)-104(M) and ablation susceptible layers 102(1)-102(N). Note that each ablation insusceptible layer 104(1)-104(M) exhibits one or more geometric patterns. For example, ablation insusceptible layer 104(1) further comprises geometric patterns 108(1)-108(3), ablation insusceptible layer 104(2) further comprises geometric patterns 108(4)-108(5) and ablation insusceptible layer 104(M) further comprises geometric pattern 108(6). Geometric patterns 108(1)-108(6) are merely exemplary and are not intended to limit the scope of the invention. As described in more detail below, geometric patterns such as exemplary geometric patterns 108(1)-108(6) will contribute to the generation of geometric features in a mounting structure that allows precise mounting of optical components after an ablation process is performed.

Figure 1C:
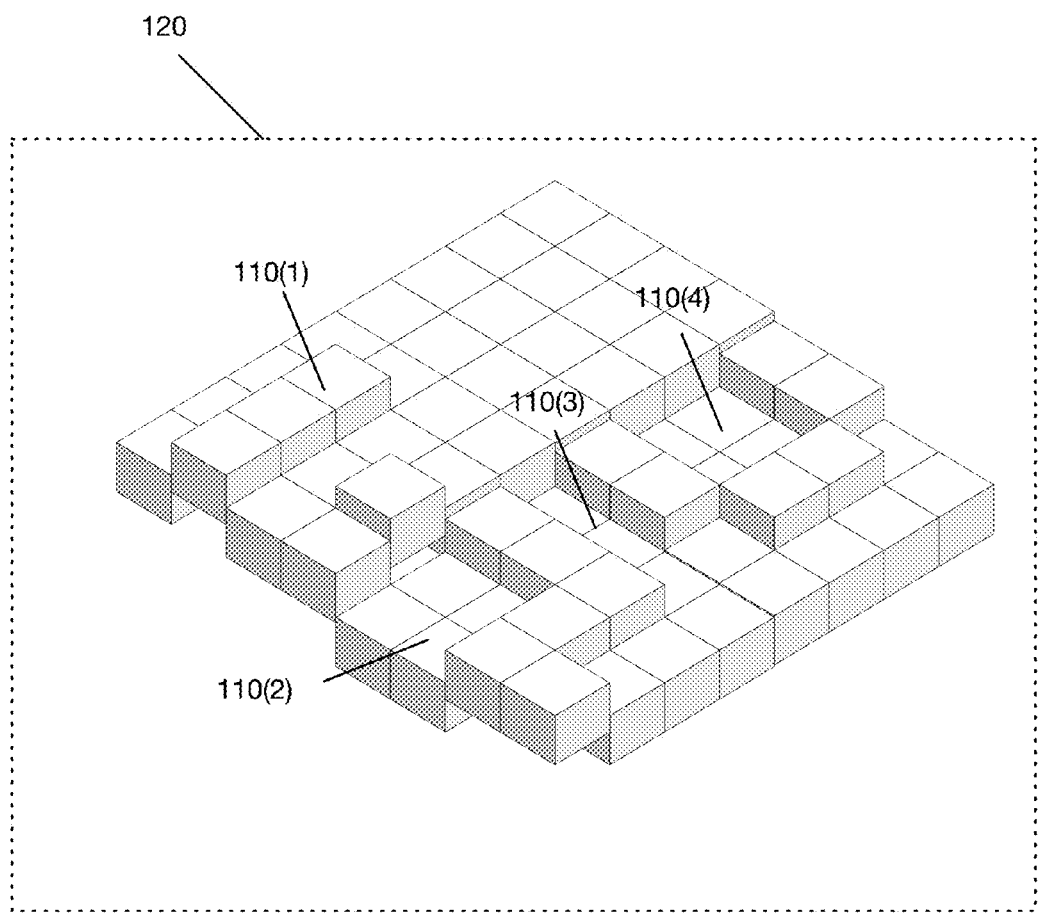
FIG. 1C shows an exemplary mounting structure with a number of generated geometric features subsequent to an ablation process according to one embodiment.

FIG. 1C shows an exemplary mounting structure with a number of generated geometric features subsequent to an ablation process according to one embodiment. Mounting structure 120 comprises a number of exemplary geometric features 110(1)-110(4). Features 110(1)-110(4) may be designed and utilized for mounting one or more optical components. Geometric features 110(1)-110(4) are merely exemplary and are not intended to limit the scope of the invention.

Exemplary features 110(1)-110(4) are generated from an ablation process applied to a stack of alternating ablation susceptible and ablation insusceptible layers such as that shown in FIG. 1B. Each ablation insusceptible layer (e.g., 104(1)-104(M)) has an associated geometric pattern, which serves as a mask for an ablation process. An ablation process applied to the combination of ablation insusceptible layers 104(1)-104(M) and ablation susceptible layers 102(1)-102(N) yields geometric features such as 110(1)-110(4) shown in FIG. 1C.

In particular, ablation insusceptible layers 104(1)-104(M), whereby geometric patterns are defined, serve as a mask for ablation of the surrounding ablation susceptible layers 102(1)-102(N). The final shape of a generated part is then defined by the ablation insusceptible layers, e.g., metal. Such a process does not require tight positioning accuracy of the laser. The generation of an exemplary carrier part via a set of ablation insusceptible and ablation susceptible layers and an ablation process is described below with respect to FIGS. 3-8.

According to one embodiment an ablation process may be performed by micro machining with an excimer laser removing tiny bits of material in a programmed manner. Alternatively, an ablation process can be performed using a laser process that operates in a larger area, which is less controllable and which uses a metal layer of the part to mask the ablation process.

Fabrication Process

Figure 2:
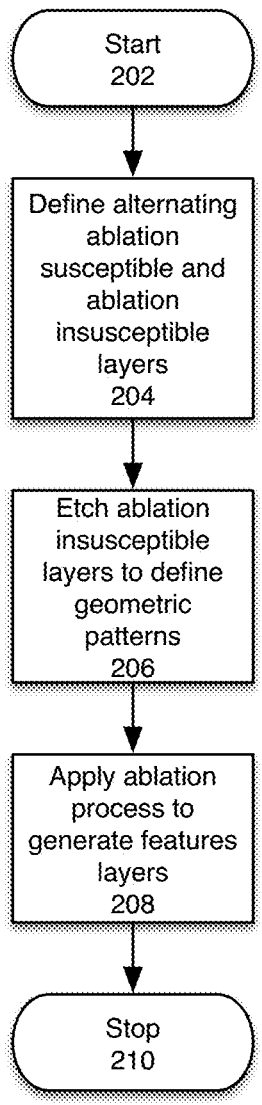
FIG. 2 is a flowchart depicting a process for generating an optical mounting apparatus for mounting at least one optical component for creating an optical link.

FIG. 2 is a flowchart depicting a process for generating an optical mounting apparatus for mounting at least one optical component for creating an optical link. The process is initiated in 202. In 204, a set of ablation insusceptible layers 104(1)-104(M) and a set of ablation susceptible layers 102(1)-102(N) are defined. In 206, the ablation insusceptible layers are etched to define a geometric pattern in each layer. It is recognized that various etching processes are well known in the PCB manufacturing industry. In 208, an ablation process is applied to the set of ablation insusceptible layers 104(1)-104(M) and ablation susceptible layers 102(1)-102(N) to generate a carrier part. The process ends in 210.

Carrier Part

Figure 3:
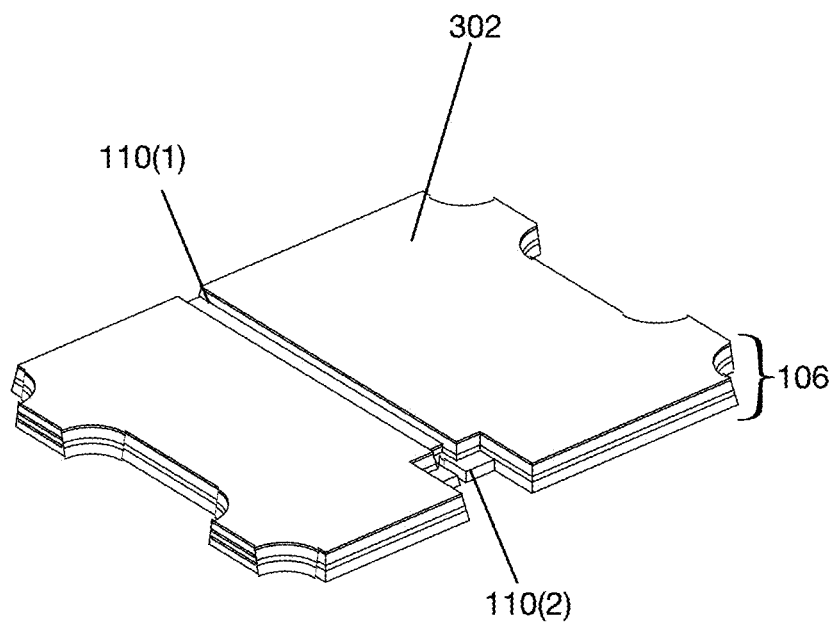
FIG. 3 shows a carrier part for mounting a fiber optical cable and an optical die precisely generated from an ablation process according to one embodiment.

FIG. 3 shows a carrier part for mounting a fiber optical cable and an optical die precisely generated from an ablation process according to one embodiment. Carrier part 302 comprises stack 106 of ablation insusceptible layers 104(1)-104(M) and ablation susceptible layers 102(1)-102(N). Carrier part 302 comprises a number of geometric features, e.g., 110(1)-110(2) generated from an ablation process. Geometric feature 110(1) is a trench or fiber alignment groove for mounting an optical fiber. Geometric feature 110(2) provides for mounting of an optical die.

Figure 4A:
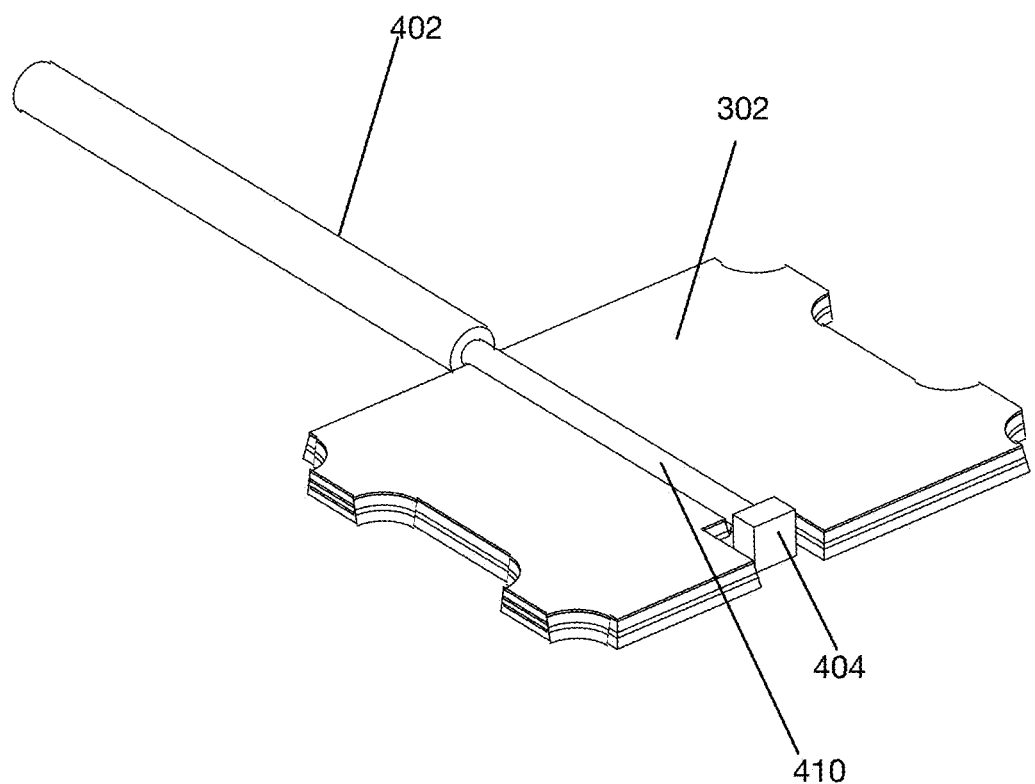
FIG. 4A shows a carrier part with a fiber optical cable and optical die mounted according to one embodiment.

FIG. 4A shows a carrier part with a fiber optical cable and optical die mounted according to one embodiment. As shown in FIG. 4A, optical fiber with cladding removed 410 is mounted in the trench feature 110(1) previously shown in FIG. 3 and optical die 404 is mounted in the optical die mounting feature 110(2) previously shown in FIG. 3. Optical die 404 may house either a photo diode or a laser diode. FIG. 4A also shows optical fiber with cladding 402.

Figure 4B:
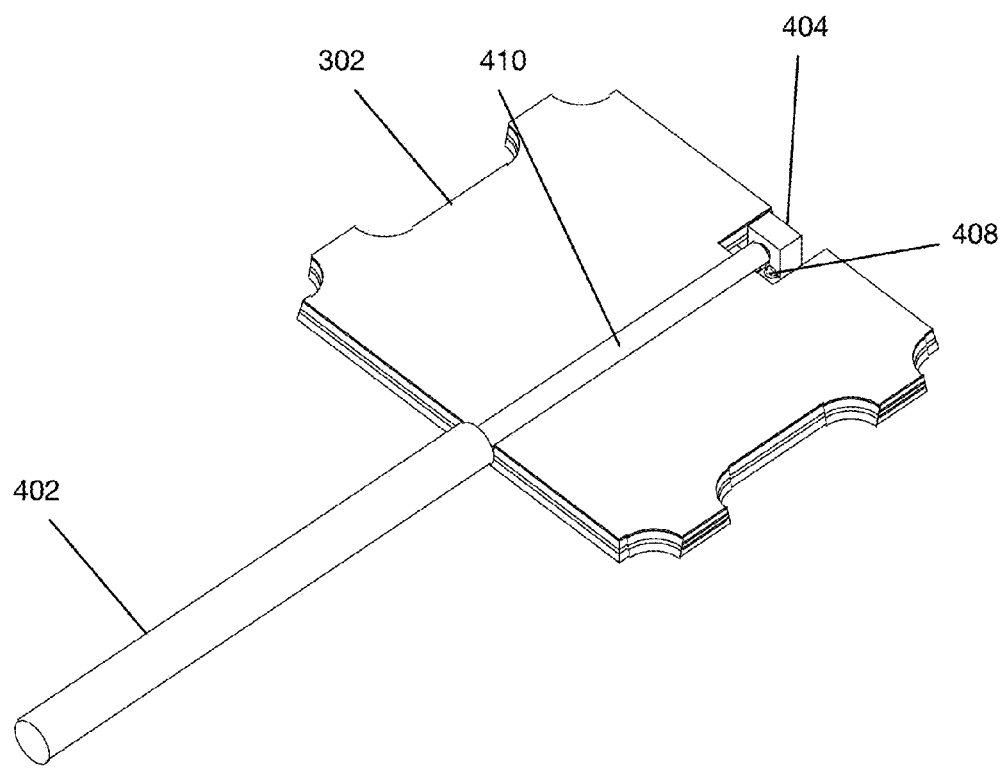
FIG. 4B shows an alternative depiction of a carrier part with a fiber optical cable and optical die mounted according to one embodiment.

FIG. 4B shows an alternative depiction of a carrier part with a fiber optical cable and optical die mounted according to one embodiment. In particular, FIG. 4B shows electrical adhesive or solder 408 which is used to electrically couple optical die 404 to an amplifier or driver chip (not shown in FIG. 4B).

Figure 5A:
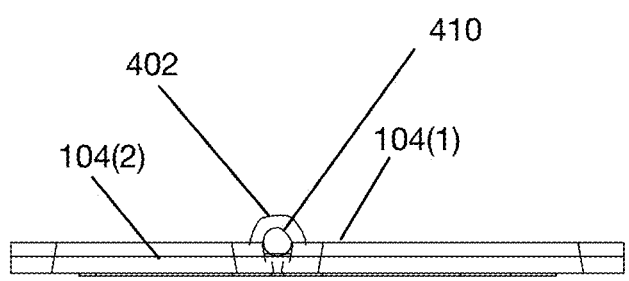
FIG. 5A shows mechanical references of a carrier part for a fiber optical cable according to one embodiment.

FIG. 5A shows mechanical references of a carrier part for a fiber optical cable according to one embodiment. FIG. 5A shows optical fiber with cladding 402. Optical fiber with cladding removed 410 is mounted on top of ablation insusceptible layer 104(2), which may be copper. A second ablation insusceptible layer 104(1) provides further sideways support for mounting of optical fiber without cladding 402. Ablation insusceptible layers 104(1)-104(2) correspond directly to identically labeled elements in FIG. 8, which is described in detail below.

Figure 5B:
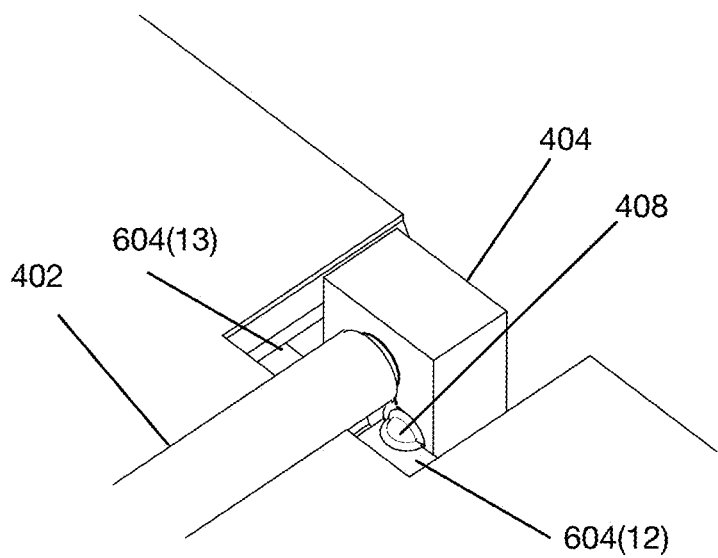
FIG. 5B depicts an electrical connection to an optical die and butt coupled fiber optical cable in a carrier part according to one embodiment.

FIG. 5B depicts an electrical connection to an optical die and butt coupled fiber optical cable in a carrier part according to one embodiment. In particular, FIG. 5B shows electrical adhesive or solder 408, which is used to couple optical die 408 to electrical tracks 604(12) and 604(13), which are electrically coupled to an amplifier or driver chip (described below with respect to FIG. 8).

Figure 6:
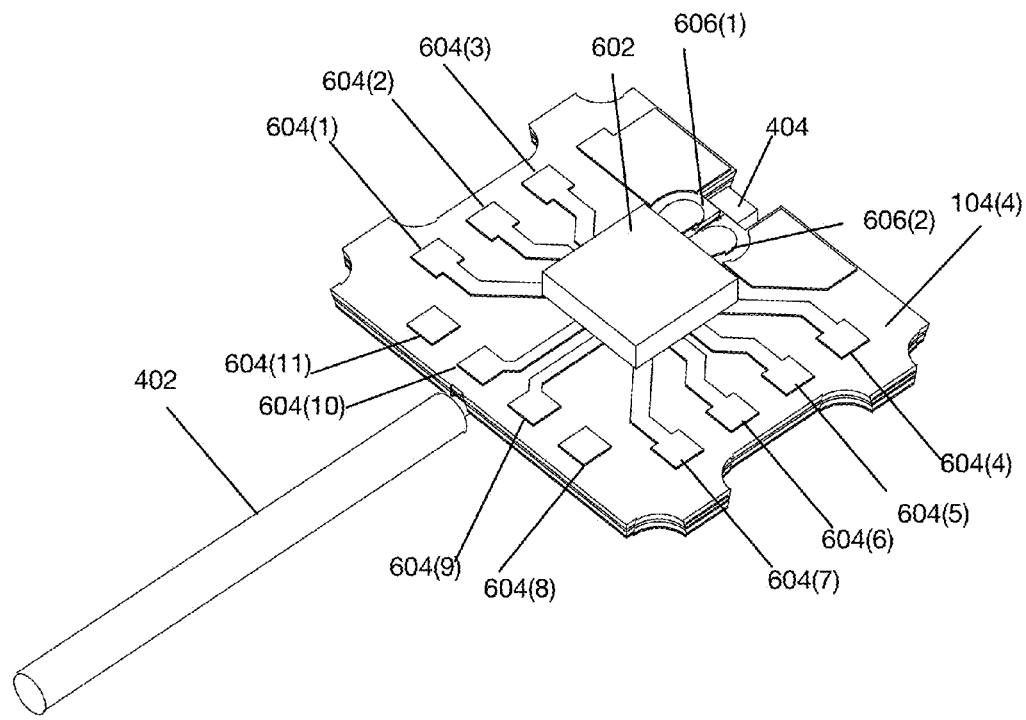
FIG. 6 shows the underside of a carrier part further comprising a driver or amplifier chip and various tracks and pads for PCB mounting according to one embodiment.

FIG. 6 shows the underside of a carrier part further comprising a driver or amplifier chip and various tracks and pads for PCB mounting according to one embodiment. Tracks 606(1) and 606(2) are electrically coupled to optical die 404 via electrical pads 604(12)-604(13) (described in FIG. 5B). Pads 604(1)-604(11) provide for coupling to a PCB.

Figure 7A:
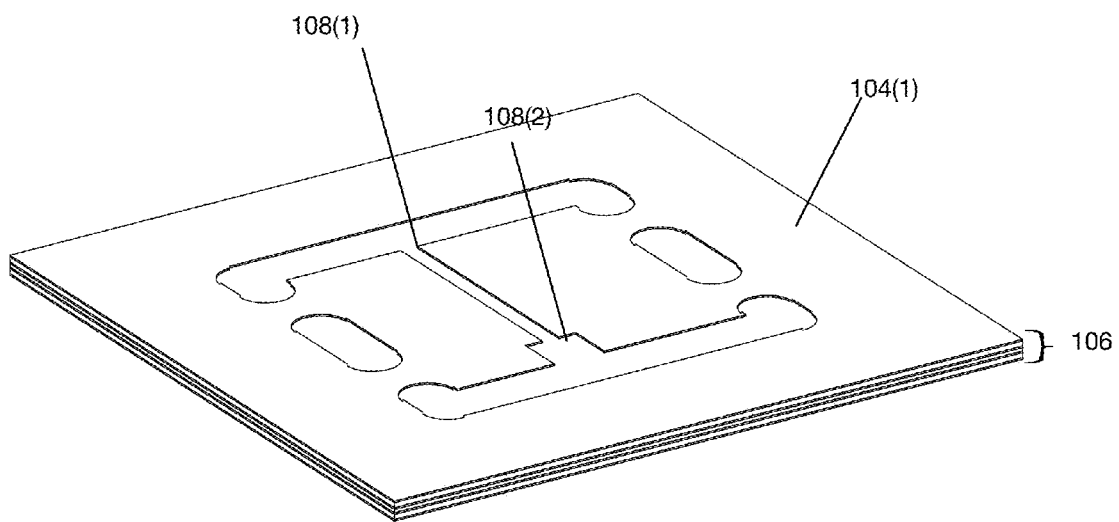
FIG. 7A shows an exemplary carrier part mounted in a panel prior to application of an ablation process according to one embodiment.

FIG. 7A shows an exemplary carrier part mounted in a panel prior to application of an ablation process according to one embodiment. Stack 106 comprises ablation susceptible layers and ablation insusceptible layers. FIG. 7A also shows a plurality of geometric features in the top ablation insusceptible layer 104(1). In particular, ablation insusceptible layer 104(1) shows geometric feature 108(1), which will be utilized to generate a trench feature for mounting an optical fiber and geometric feature 108(2), which will be utilized to generate an optical die mount. Additional geometric features shown in FIG. 7A, which are not labeled, are utilized to generate slots that separate the carrier part from the panel over the largest part of the circumference to allow for easy separation from the panel later.

Figure 7B:
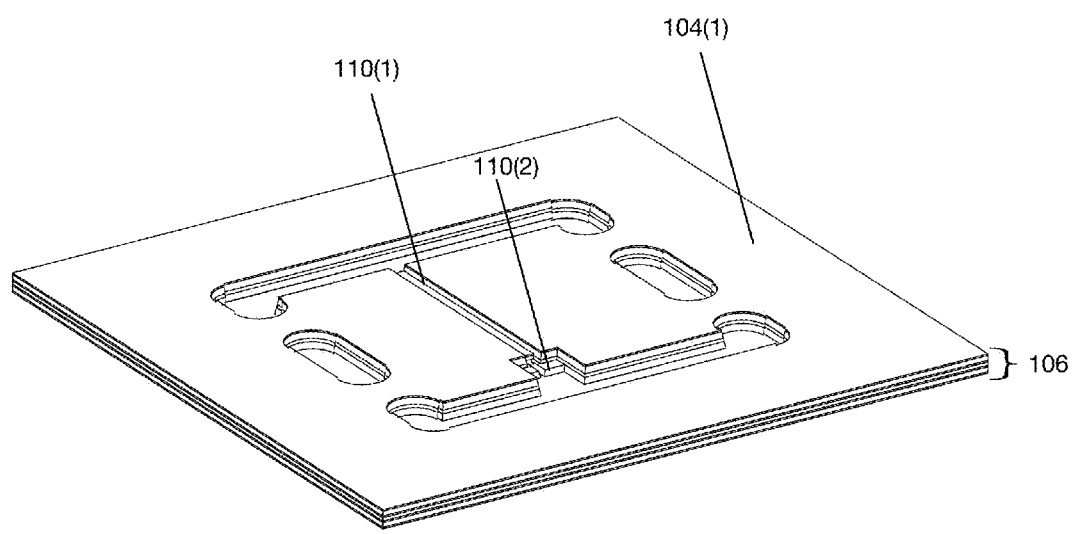
FIG. 7B shows an exemplary carrier part mounted in a panel subsequent to application of an ablation process according to one embodiment.

FIG. 7B shows an exemplary carrier part mounted in a panel subsequent to application of an ablation process according to one embodiment. Subsequent to an ablation process a number of geometric features are generated including trench 110(1) and optical die mount 110(2).

Figure 8:
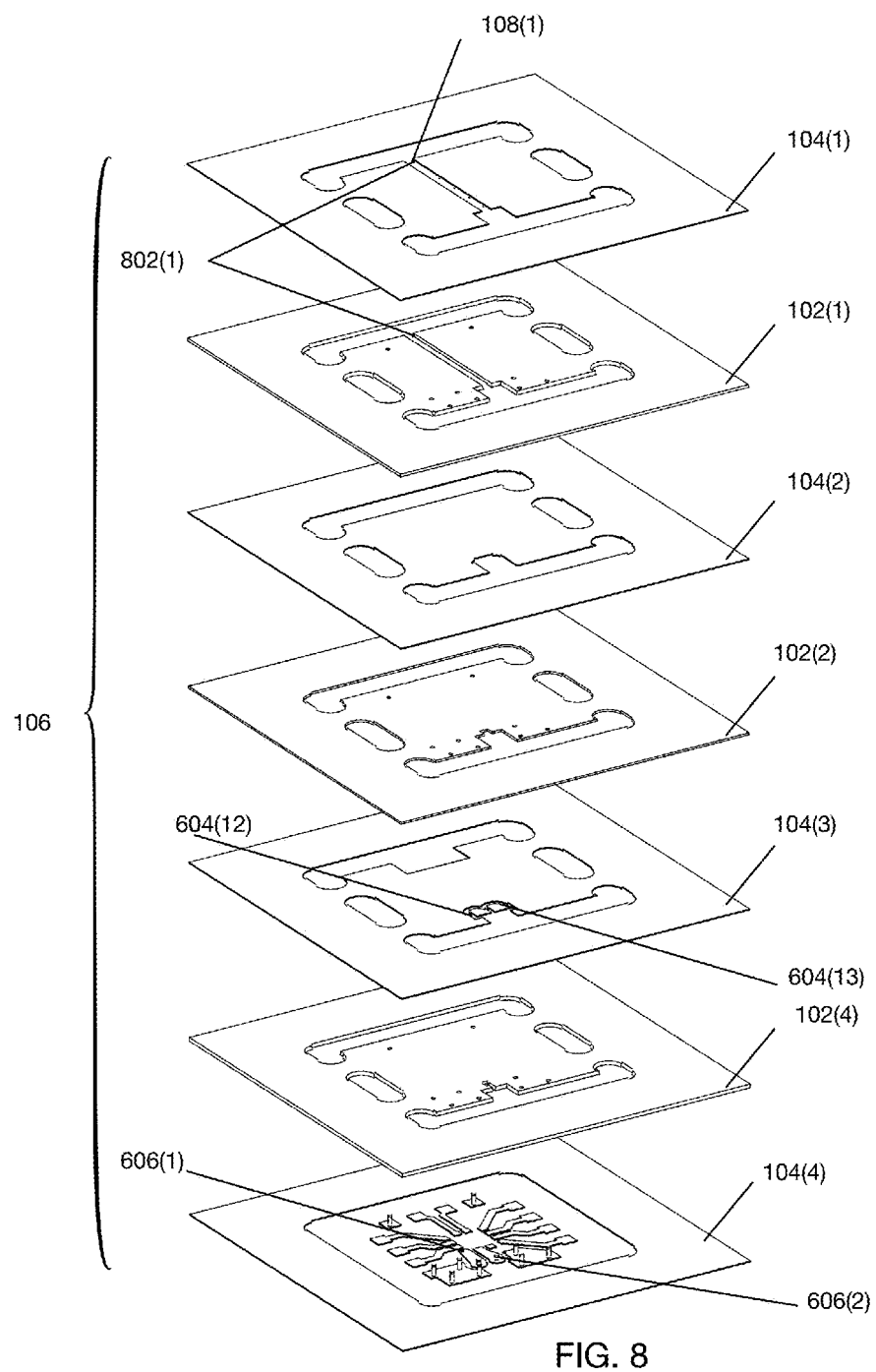
FIG. 8 shows a set of copper and polyimide layers subsequent to an ablation process revealing a set of geometric features for a carrier part.

FIG. 8 shows a set of copper and polyimide layers subsequent to an ablation process revealing a set of geometric features for a carrier part. Stack 106 comprises ablation insusceptible layers 104(1)-104(4) and ablation susceptible layers 102(1)-102(4). Ablation insusceptible layers 104(1)-104(4) may be comprised of copper. As shown in FIG. 8, ablation susceptible layers 102(1)-102(4) may be comprised of polyimide. Ablation insusceptible layer 104(1) has been etched to generate a number of geometric features, e.g., 108(1). After an ablation process is applied, the mask formed by ablation insusceptible layer 104(1) and ablation susceptible layer 102(1), generate a trench feature 802(1).

Tracks 606(1) and 606(2) are coupled to ablation insusceptible layer 104(3) via pads 604(12) and 604(13) respectively using vias. All other connections traverse all layers and connect ground layers to one another.

Using ablation insusceptible masking layers (e.g., metal such as copper), the processing may begin with a common PCB structure and alternating polyimide and metal layers, wherein the metal layers are structured by etching. The top metal layer may be almost completely closed, but may leave a narrow slot exposing the polyimide. The polyimide can then be laser ablated creating a trench that positions a fiber sideways. To define the depth of the trench and thus the height of the reference fiber, a second metal layer 104(2) may be introduced to stop the ablation of the trench.

A third metal layer (104(3)) of the PCB structure may contain pads 604(12)-604(13) to couple to an optical die (not shown in FIG. 8). During the laser ablation, the polyimide may be removed from these pads points. The optical die can be connected by soldering or conductive adhesive or another suitable connection method. A fourth metal layer 104(4) may be introduced, which provides no functionality as an ablation mask but instead contains tracks and bonding pads for a driver or amplifier and pads to connect it to the PCB of a device.

The carrier part can be manufactured as a common PCB although the required accuracy is somewhat challenging. As it is a small part (e.g., 2 mm by 3 mm), many carrier parts may fit in a standard PCB panel. The laser ablation process may also be performed while the carrier part is still in the panel reducing handling. The laser ablation process can be applied also to partially cut the carrier parts from the panel and to make them easily removable for subsequent assembly steps. Alternatively, the partial disconnect from the panel may also be performed with common PCB manufacturing technology such as milling. For subsequent assembly steps, the carrier part may remain in the full panel or the panel may be cut into smaller sub-panels holding the carrier parts, or the carrier parts can be cut loose.

The accuracy of the fabrication process herein described originates from the etching process itself. The laser process isn't required to be highly accurate. Although an accurate laser process would be possible, such an approach would be time consuming and hence more expensive. This is because a high precision laser requires narrow laser beam, which can only ablate tiny bits of material at a time. As the accuracy can be obtained from the etching process herein described, speed is obtained in the ablation process.

According to one embodiment, a carrier part may be fabricated having the features of a fiber alignment groove (same as trench), pads for mounting an optical die, pads for mounting a driver or amplifier and pads for connecting to a less accurate and therefore low cost PCB. The order of subsequent assembly steps can be selected in the most practical manner for the application at hand. For example, the fiber could be assembled as a first step so that it is possible to align the optical die directly to the fiber. However, it might also be practical to finish the whole part, mount it on a device PCB and as a last step connect a certain length of fiber. It is often practical to mount the driver or amplifier while the carrier part is still in the panel, cut the panel into smaller sub-panels to mount the optical die and then either mount the fiber or assemble on a PCB or vice versa.

Having thus described a few particular embodiments of the invention, various alterations, modifications, and improvements will readily occur to those skilled in the art. Such alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A carrier for precisely mounting at least two optical/electrical elements comprising:
   a plurality of layers of first and second materials, said first material being susceptible to erosion by ablation and said second material being insusceptible to erosion by ablation,
   wherein said plurality of layers comprises at least one mask layer of said second material overlaying a layer of said first material to define masked and unmasked portions of said carrier, said first material of said layer being ablated from said unmasked portions, thereby defining at least one feature of a plurality of features configured to receive at least one of said at least two optical/electrical elements.

2. The carrier according to claim 1, wherein the first material is polyimide.

3. The carrier according to claim 1, wherein the second material is copper.

4. The carrier according to claim 1, wherein one of the at least two optical/electrical elements is a fiber optic cable.

5. The carrier according to claim 1, wherein one of the at least two optical/electrical elements is an optical die.

6. The carrier according to claim 5, wherein the optical die comprises a laser.

7. The carrier according to claim 5, wherein the optical die comprises a photodiode.

8. The carrier according to claim 1, wherein said features comprise at least one of a fiber alignment groove, an optical die mount, pads for mounting at least one of a driver or an amplifier, or pads to connect to a PCB device.

9. An optical engine comprising:
   a carrier part, wherein the carrier part further comprises a plurality of features configured for receiving one or more optical/electrical elements, said plurality of features formed from an ablation process applied to a plurality of layers of first and second materials, said first material being susceptible to erosion by ablation and the second material being insusceptible to erosion by ablation, wherein said plurality of layers comprises at least one mask layer of said second material overlaying a layer of said first material to define masked and unmasked portions of said carrier, said first material of said layer being ablated from said unmasked portions, thereby defining at least one of said plurality of features;
   an optical die disposed on a first feature of said plurality of features;
   an optical amplifier disposed on a second feature of said plurality of features; and
   at least one pad defined at least in part by a third feature of said plurality of features for coupling to a printed circuit board ("PCB").

10. The optical engine according to claim 9, wherein the first material is polyimide.

11. The optical engine according to claim 9, wherein the second material is copper.

12. The optical engine according to claim 9, further comprising optical fiber disposed on a fourth feature of said plurality of features.

13. The optical engine of claim 9, wherein the optical die is oriented perpendicular to a circuit board.

14. The optical engine of claim 9, wherein said plurality of layers comprises at least a second mask layer of said second material overlaying a second layer of said first material to define masked and unmasked portions of said carrier, said first material of said second layer being ablated from said unmasked portions to define at least one feature of said plurality of features.

15. The carrier of claim 9, wherein at least a portion of said mask layer is at least one of a pad, trace, or reflective surface.

16. The carrier of claim 5, wherein the optical die is oriented perpendicular to a circuit board.

17. The carrier of claim 1, wherein said plurality of layers comprises at least a second mask layer of said second material overlaying a second layer of said first material to define masked and unmasked portions of said carrier, said first material of said second layer being ablated from said unmasked portions.

18. The carrier of claim 1, wherein at least a portion of said mask layer is at least one of a pad, trace, or reflective surface.

* * * * *